United States Patent [19]

Barker et al.

[11] Patent Number: 5,633,640
[45] Date of Patent: May 27, 1997

[54] METHOD AND APPARATUS FOR A DATA CONVERTER WITH A SINGLE OPERATIONAL AMPLIFIER

[75] Inventors: Todd L. Barker, Pflugerville; Alan L. Westwick, Austin, both of Tex.

[73] Assignee: Motorola, Inc., Schaumburg, Ill.

[21] Appl. No.: 349,592

[22] Filed: Dec. 5, 1994

[51] Int. Cl.$^6$ .................................................. H03M 1/12
[52] U.S. Cl. ............................................................ 341/163
[58] Field of Search ................................. 341/163, 108, 341/166, 164, 152, 169

[56] References Cited

U.S. PATENT DOCUMENTS 4,243,975   1/1981   Masuda et al. .......................... 341/168
5,373,292  12/1994   Yasuda ..................................... 341/108

Primary Examiner—Brian K. Young
Attorney, Agent, or Firm—Craig J. Yudell

[57] ABSTRACT

A data converter (10) includes an analog input element (12), an operational amplifier (14), a first reference input element (18), a second reference input element (22), and a control element (34). The analog input element (12) operably couples the analog signal to a first input (13) of the operational amplifier (14). The first and second reference input elements (18 & 22) respectively couple a first signal (16) and a second signal (22) to a first input of the operational amplifier (14). The control element (34) generates the control signal based on an output of the operational amplifier (14) to force the first input node (13) to be equivalent to the second input node (15) of the operational amplifier (14). The data converter (10) also includes an analog-to-digital converter (26) that allows the circuit to perform a sigma-delta conversion.

21 Claims, 6 Drawing Sheets

FIG.1 -PRIOR ART- 5,633,640

METHOD AND APPARATUS FOR A DATA CONVERTER WITH A SINGLE OPERATIONAL AMPLIFIER

TECHNICAL FIELD OF THE INVENTION

The present invention relates generally to data conversion circuitry and more particularly to a data converter having integrated reference circuitry.

BACKGROUND OF THE INVENTION

As is known, data conversion circuitry converts analog signals into a discrete digital format which can then be processed by a digital signal processor. The analog-to-digital conversion may be accomplished by a variety of circuits. For example, one such circuit, which is called sigma-delta converter, is shown in FIG. 1.

FIG. 1 illustrates a single-stage, single-bit, sigma-delta converter. In the first stage of the converter, a voltage reference signal ($V_{out}$) is selectively combined with an incoming analog signal to produce a combined signal. Typically, the voltage reference is either added or subtracted from the incoming analog signal depending upon the level of the analog signal and the prior state of the digital output of the converter. The combined signal then serves as an input to an integrator which integrates the combined signal. The integrator output then serves as an input to an analog-to-digital (A/D) element which produces a digital output signal at each clock cycle. Typically, when the input of the A/D element exceeds a threshold, the A/D element produces a logic high output signal. Alternatively, when the input does not exceed the threshold, the A/D element produces a logic low output signal. Based upon the output of the A/D element, a feedback path selectively alters the manner in which the voltage reference is combined with the analog signal in an attempt to force the voltage across the integrator's inputs to zero. In the circuit shown in FIG. 1, the digital output signal is used to control the circuitry which selectively combines the voltage reference signal with the analog input signal. Hence, the digital output signal determines the polarity of the reference signal that is combined with the analog input signal.

As is known in the art, a variety of circuits and techniques may be used to convert an analog input signal to an equivalent digital output signal, each with its relative benefits and drawbacks. While the converter illustrated in FIG. 1 is a single bit converter, the conversion technique may be expanded to multiple-bit conversion processes, successive approximation processes, and other processes. A common requirement among all of the processes, however, is the requirement of a voltage reference of a fixed voltage level that is used to selectively combine with the analog input signal. In order for the data conversion circuitry to perform optimally, the voltage reference must be noise free and temperature invariant.

A circuit commonly used to produce a temperature invariant voltage reference is also illustrated in FIG. 1 and occupies the upper left hand portion of FIG. 1 and is designated as a voltage reference. The circuit includes two current-driven bipolar transistors, a switched capacitor network, and a summing amplifier. The bipolar transistors, driven at two different current densities, produce differing base-to-emitter voltages ($V_{BE}$). Because the base-to-emitter voltage exhibits a negative temperature coefficient and the difference between the base-to-emitter voltages of the transistors $\Delta V_{BE}$ exhibits a positive temperature coefficient, the signals may be selectively combined to produce a temperature invariant voltage reference. As illustrated in FIG. 1, a switched capacitor array and a summing amplifier may be employed to produce the temperature invariant voltage reference (referred to as $V_{out}$) according to the equation shown.

A shortcoming of the standard temperature invariant voltage reference circuitry relates to the circuit components used. The voltage reference circuitry requires both a switched capacitor network and a summing amplifier to create the temperature invariant voltage reference. These components not only require additional components on the chip but add complexity, consume power, and generate additional heat.

Further, in a typical integrated circuit that includes an A/D converter, the voltage reference circuitry resides at a location removed from the A/D converter. Thus, noise couples onto the voltage reference transmission path and resultantly becomes a part of the voltage reference. Noise in the voltage reference negatively affects the performance of the conversion process. Therefore, a large external bypass capacitor is usually employed to reduce the noise on the voltage reference. The external bypass capacitor also improves the power supply rejection ratio of the converter. Unfortunately, two pin-outs must be added to the chip and additional footprint area is needed to accommodate the bypass capacitor.

Still further, by examining the circuit of FIG. 1, it can be seen that for a single stage sigma-delta converter, two operational amplifiers are needed: One for the voltage reference and a second for the data converter section. As mentioned above, by utilizing the circuit of FIG. 1 additional components are needed which has the above mentioned drawbacks.

Therefore, a need exists for a converter that reduces component count, reduces complexity, reduces power consumption, and eliminates the need for the external pins to filter noise from the voltage reference while still providing a reliable analog-to-digital conversion.

DETAILED DESCRIPTION OF THE DRAWINGS

Generally, the present invention provides an apparatus and method for converting analog data into digital data via a data converter that, for a first order converter, includes a single operational amplifier. This may be accomplished by combining, in a controlled manner, a plurality of temperature variant signals with an analog input signal (i.e., the analog data). The combining of the temperature variant signals with the analog input signal is controlled by a controlling element, wherein the controlling element generates a control signal based on a clock signal and an output signal of the data converter. With such a method and apparatus, a single order data converter may be achieved using a single operational amplifier, thereby reducing component count, reducing circuit complexity, reducing power consumption, and eliminating the need for voltage reference filtering pins in comparison with the prior art converter. In addition, the present converter provides a reliable analog-to-digital conversion.

Figure 1:
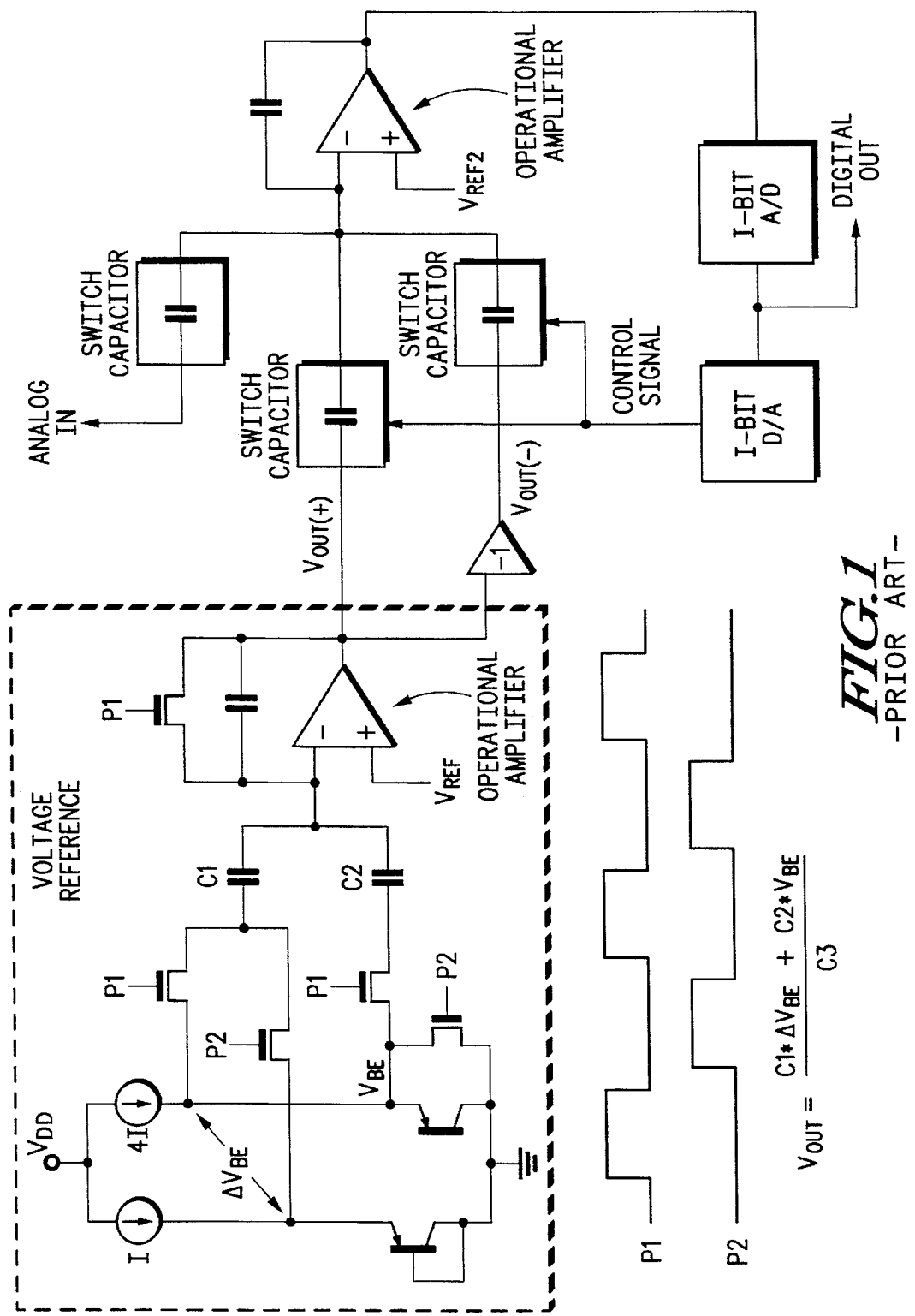
FIG. 1 illustrates the prior art voltage reference circuitry and a first order sigma-delta converter.
Figure 2:
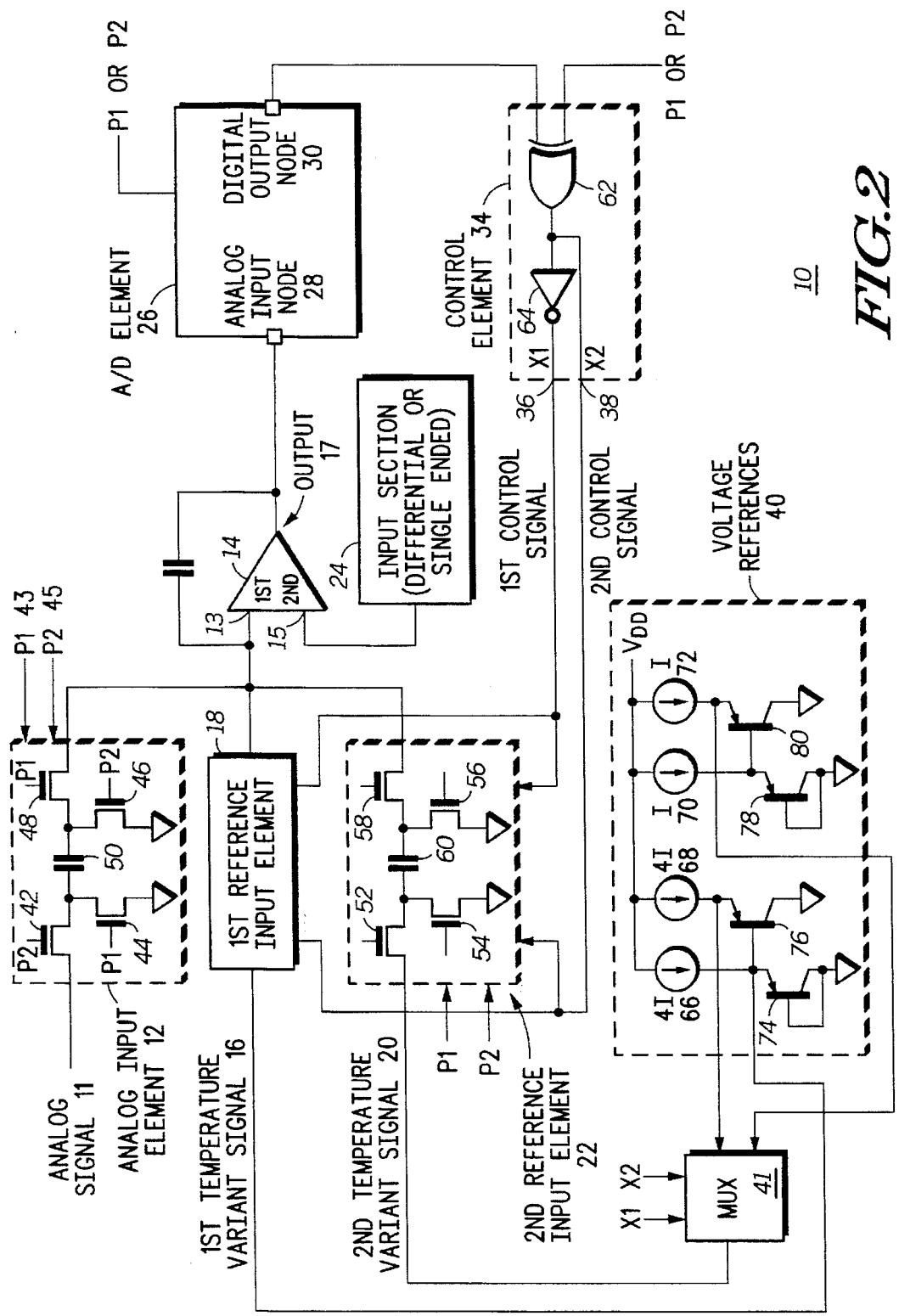
FIG. 2 illustrates a schematic block diagram of a first embodiment of a converter in accordance of the present invention.

FIG. 2 illustrates a schematic block diagram of a data converter 10 which comprises an analog input element 12, an operational amplifier 14, a first reference input element 18, a second reference input element 22, and a control element 34. Preferably, the converter 10 also includes an analog-to-digital (A/D) element 26. The converter 10 operates in a sigma-delta mode to convert an analog input signal 11 to an intermediate signal at an output 17 of the operational amplifier 14 and to a digital output signal 32 at a digital output node 30 of the A/D element 26.

The analog input element 12 operably couples the analog input signal 11 to a first input node 13 of the operational amplifier 14. The analog input element 12 may be any device that has an impedance, wherein the impedance is based on the desired transfer function of the overall circuit. For example, the analog input element 12 may be a resistor, a complex network, or a switched capacitor array that includes a capacitor 50 and four switches 42, 44, 46, and 48. The switched capacitor is gated by a clock signal which includes a first phase ($P_1$) 43 and a second phase ($P_2$) 45, wherein the $P_1$ 43 and $P_2$ 45 are complementary and non-overlapping. In general, the switched capacitor array serves to transfer charge from the input of the array to an output of the array. While the switched capacitor array may be viewed simply as a charge transfer element, it may also be viewed as a resistive element. Viewed in either manner, the switched capacitor array couples a representation of the analog input signal 11 to the first input node 13.

The first reference input element 18 and the second reference input element 22 are substantially identical in construction. Therefore, only the structure of the second reference input element 22 is shown in detail and discussed. The second reference input element 22 may be any device that has an impedance, wherein the impedance is based on the desired transfer function of the overall circuit. For example, the second reference input element 22 may be a resistor, a complex network, or a switched capacitor array that includes a capacitor 60 and four switches 52, 54, 56, and 58. Gating of the switched capacitor is controlled by the first and second phases of the clock signal P1 43 and P2 45 and a control signal that includes two phases X1 36 and X2 38 selectively connected between the element's input and output connections. Details of the control signal will be discussed below with reference to the control element 34.

While the reference input elements 18 and 22 have similar construction, they do vary in their input connections. To illustrate, the first reference input element 18 receives, as its input, a first signal 16 that may be temperature variant and the second reference input element 22 receives, as its input, a second signal 20 that may be temperature variant. Thus, in operation, the first reference input element 18 operably couples either adds or subtracts the first temperature variant signal 16 to, or from, the first input node 13. Likewise, the second reference input element 22 either adds or subtracts the second temperature variant signal 20 to, or from, the first input node 13. The addition/subtraction of the signals 16, 20 coupled by the first reference input element 18 and the second reference input element 22 is dependent upon the control signals $X_1$ 36 and $X_2$ 38 which causes the converter 10 to maintain its accuracy over a wide temperature range even though the first and second signals 16, 20 may have different temperature coefficients.

Continuing with the discussion of FIG. 2, the operational amplifier 14 includes a capacitor connected from an output 17 to the first input node 13 thus causing the operational amplifier 14 to perform an integration function on the signals presented to inputs 13 and 15. The signal present at the second input node 15 may be a reference voltage for single ended operation or an equivalent input section as that coupled to the first input node 13 for differential operation. As discussed above, the signal present at first input node 13 is a combination of the analog input signal 11, the first temperature variant signal 16, and the second temperature variant signal 20. Thus, the output 17 represents an integration of these signals which presents an intermediate signal and provides an input to the A/D element 26.

To further illustrate the signal present at the second input node 15, the second input node may be coupled to an input section 24 which provides the single ended mode or the differential mode of operation. In the single ended mode, the input section 24 connects the second terminal 15 to an analog reference voltage. The reference voltage could be chosen to be ground, one-half of a supply voltage level, or at another fixed level. When the input section 24 is providing the differential mode, the second terminal 15 connects to a differential circuit. The differential circuit (not shown) is substantially identical to the circuitry that is coupled to the first input node 13. For example, it combines an inverted polarity representation of the analog input signal 11, the first temperature variant signal 16, and the second temperature variant signal 20. In the differential mode, the input signal presented to the operational amplifier 14 across the first input node 13 and second input 15 represents a difference between two voltages instead of a difference between a voltage at the first input node 13 and a ground reference. As one skilled in the art will readily appreciate, the differential mode connection functions to reduce noise in the converter 10 by preventing noise on the ground plane from serving as a component of a single ended reference. Connected differentially, any coupled noise tends to offset and cancel itself in the conversion process therefore resulting in less error due to noise.

As mentioned, the first and second temperature variant signals 16, 20 are combined with the analog input signal 11 to provide an input to the first input node 13 for the singled ended circuit, and to both input nodes 13, 15 for the differential mode circuit. The first and second temperature variant signals 16, 20 are generated by a voltage reference circuit 40. The voltage reference circuit 40 comprises a plurality of bipolar transistors 74, 76, 78, 80 and a plurality of current sources 66, 68, 70, 72. As shown, current sources 66 and 68 provide a current to transistors 74 and 76, while current sources 70 and 72 provide a current to transistors 78 and 80, wherein the current provided by current sources 66 and 68 is 4 times the current provided by current sources 70 and 72. The first temperature variant signal 16 is representative of the voltage at the emitter of transistor 74, while the second temperature variant signal 20 is representative of either the voltage at the emitter of transistor 76 or the emitter of transistor 80. The particular voltage used as the second signal 20 is determined by the control signals X1 36 and/or X2 38 which are applied to a multiplexer 41.

In order for the first signal 16 to be different than the second signal 20, the base-emitter voltages ($V_{BE}$) of transistor 74, transistor 76, transistor 78, and transistor 80 must be different. This can be accomplished by taking advantage of the current-to-$V_{BE}$ relationship of bipolar transistors. For example, by choosing transistor 78 and transistor 80 to be four times as large as transistor 74 and transistor 76 respectively, transistors 78 and 80 have one-sixteenth the current density as transistors 74 and 76. With the base-to-emitter voltage across transistor 76 larger than that across transistor 80, a voltage difference between the first and second signals 16 and 20 is created. While the above described circuit produces a voltage difference between the first and second signals 16 and 20, this difference is not fixed because the base-to-emitter voltage signal $V_{BE}$ exhibits a negative temperature coefficient and the differential signal $\Delta V_{BE}$ exhibits a positive temperature coefficient.

The A/D element 26 comprises a comparator for comparing an analog input value present at the analog input node 28 with a reference level. An output node 30 of the A/D element 26 provides a logic high when the signal at the analog input node 28 exceeds the reference level and logic low when the analog input signal is less than the reference level. A/D elements are well known in the art and any of a number of various A/D elements could function within this particular circuit. Therefore, the particular operation of the A/D element 26 used in the preferred embodiment will not be further discussed.

The control element 34 operably couples to the output 17 of the operational amplifier 14 through the A/D element 26. The control element 34 produces control signals $X_1$ 36 and $X_2$ 38 that serve as inputs to the first reference input element 18, the second reference input element 22, and the multiplexer 41. Control signals $X_1$ 36 and $X_2$ 38 are responsive to the output 17 of the A/D element 26 as well as the clock signals $P_1$ or $P_2$. The signals feedback to force the first input node 13 of the operational amplifier to be substantially electrically equivalent to the second input node 15 of the operational amplifier 14. Thus, the control element 34 provides the feedback required in the sigma-delta conversion process.

Preferably, the control element 34 comprises an exclusive-OR gate 62 and an inverter 64. The output of the A/D element 26 and the first or second phase of the clock signal ($P_1$ or $P_2$) serve as inputs to the exclusive-OR gate 62 to produce the control signals. By utilizing $P_1$ as an input, signal $X_2$ 38 goes to a logic high level only when (1) the digital output node 30 provides a logic high level or (2) when the clock signal $P_1$ is at a logic high level, but not when both are at a logic high level. With the control signal $X_1$ 36 being the complement of the control signal $X_2$ 38, control signal $X_1$ 36 is at a logic high level when (1) clock signal $P_1$ and the digital output signal 32 are at a logic low level or (2) when both clock signal $P_1$ and the digital output node 30 provides a logic high level.

As one skilled in the art will readily appreciate, the analog input element 12, the first reference input element 18, and the second reference input element 22 may be selectively controlled in any of a number of manners using clock signals $P_1$ and $P_2$ and control signals $X_1$ 36 and $X_2$ 38. Operation of switched capacitor arrays, such as those preferably contained within the analog input element 12, the first reference input element 18, and the second reference input element 22, is well known and will not be exhaustively discussed herein.

It should be noted, however, that the control signals X1 and X2 must be regulated in such a way as to provide a closed loop feedback system, thereby forcing the first input node 13 of the operational amplifier to be substantially electrically equivalent to the second input node 15 of the operational amplifier 14. This is accomplished by either adding or subtracting a combination of the first temperature variant signal 16 and second temperature variant signal 20 to/from the analog input signal 11 depending upon the value of control signals $X_1$ 36 and $X_2$ 38. Thus, the first temperature variant signal 16 and the second temperature variant signal 20 are operably coupled to the first terminal 13 of the operational amplifier 14 to reach the desired end.

As shown and described, the circuit of FIG. 2 includes, for a first order, or single stage, data converter, a single operational amplifier 14 which is used to integrate the inputted signals. By combining the first and second signals 16 and 20 with the analog input signal as described, a separate operational amplifier to produce a voltage reference is not needed. Thus, the present invention reduces component count, reduces circuit complexity, and reduces power consumption. In addition, by converging the voltage reference with the components of the data converter, geographic separation of these circuit is eliminated, which, in turn, eliminates the need for an external filtering capacitor, and thus eliminates the need for two additional pin connections.

As a variation to the embodiment illustrated in FIG. 2, the analog input element 12 could be controlled by both clock signals $P_1$ and $P_2$ and control signals $X_1$ 36 and $X_2$ 38. In this variation, the first reference input element 18 and the second reference input element 22 would be controlled by only clock signals $P_1$ and $P_2$ such that consistent representations of the first 16 and second 20 temperature variant signals are coupled to the first terminal 13 of the operational amplifier 14. Operated in this fashion, control element 34 would effectively control a selective coupling of the analog input signal 11 to the first terminal 13 of the operational amplifier to accomplish the sigma-delta conversion process.

Figure 3:
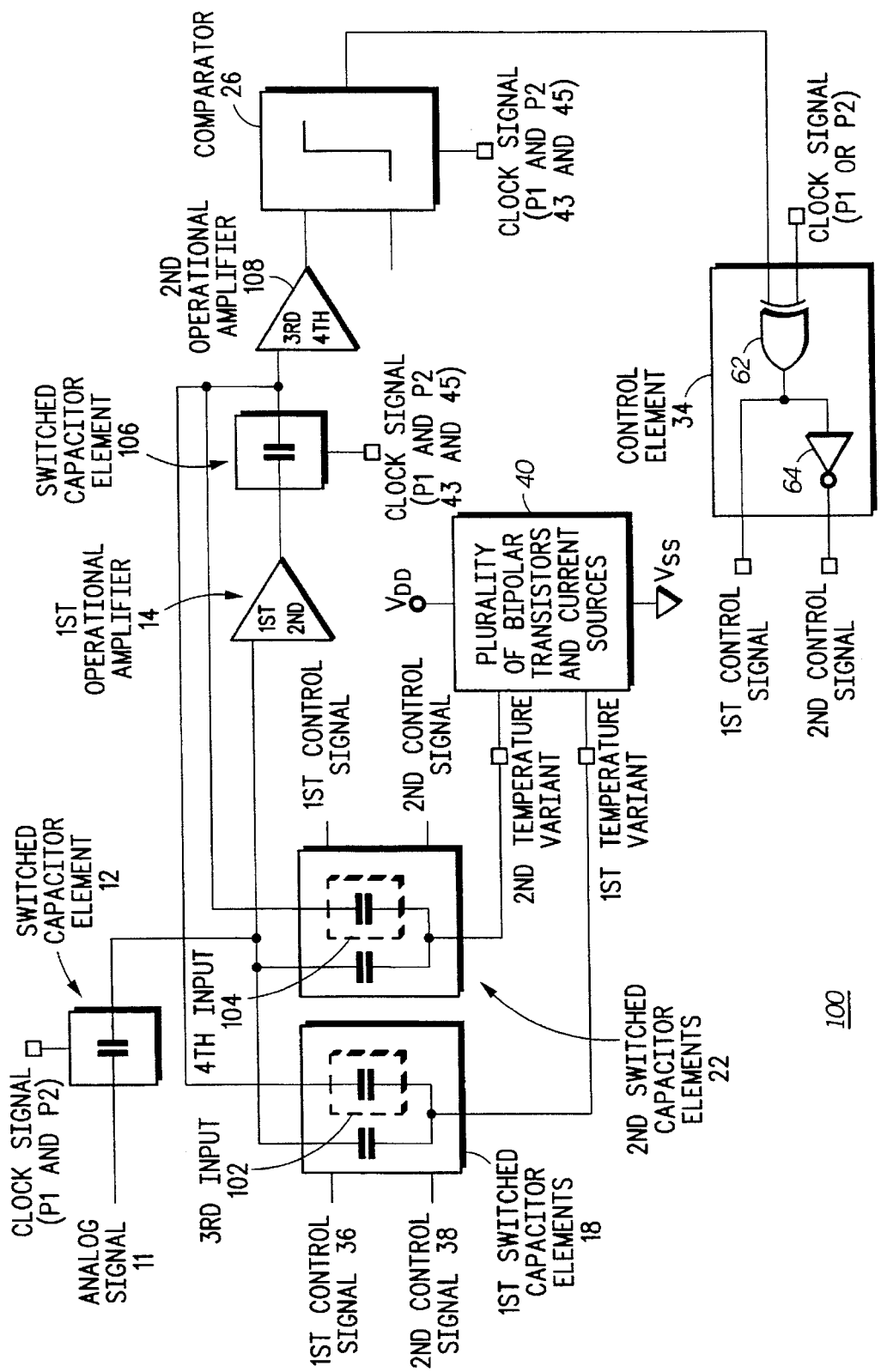
FIG. 3 illustrates a schematic block diagram of a second embodiment of a converter in accordance with the present invention.

FIG. 3 illustrates a second order, or second stage, converter 100 that is in accordance with the present invention. The converter 100 includes the analog input element 12, first reference input element 18, second reference input element 22, A/D element 26, control element 34, and the voltage reference circuit 40. These elements were discussed in detail with reference to FIG. 2, thus will not be discussed in detail. The converter 100 includes additional elements such as a third reference input element 102, a fourth reference input element 104, an additional switched capacitor element 106, and a second operational amplifier 108. The third and fourth reference input elements 102 and 104 may be complete input reference elements equivalent to the first and second reference input elements 18, 22, or the third and fourth reference input elements 102 and 104 may be a capacitor coupled to the first and second reference input elements 18, 22.

Regardless of the construct of the third and fourth reference input element 102, 104, the third element 102 operably couples the first temperature variant signal 16 to a first input of the second operational amplifier 108 and the fourth element 104 operably couples the second temperature variant signal 20 to the first input of the second operational amplifier 108. Finally, the additional switched capacitor element 106 operably couples the output of the operational amplifier 14 to the input of the second operational amplifier 108. While the additional switched capacitor element operates responsive only to clock signals $P_1$ 43 and $P_2$ 45, the third reference input element 102 and fourth reference input element 104 also operate responsively to the control signals $X_1$ 36 and $X_2$ 38.

As those skilled in the art will readily appreciate, the second operational amplifier 108 serves to push more quantization noise created by the conversion process into a higher portion of the frequency spectrum. Pushing the quantization noise out in the frequency spectrum allows digital filtering, applied to the digital output signal, to more easily filter the quantization noise from the digital signal. Thus, the embodiment of FIG. 3 provides a higher performance level than the embodiment illustrated in FIG. 2 at the expense of added circuitry and complexity. Third and higher order converters are also known in the art and not further described, although one skilled in the art will readily appreciate how the teachings of the present invention could be applied to the higher order converters.

Figure 4:
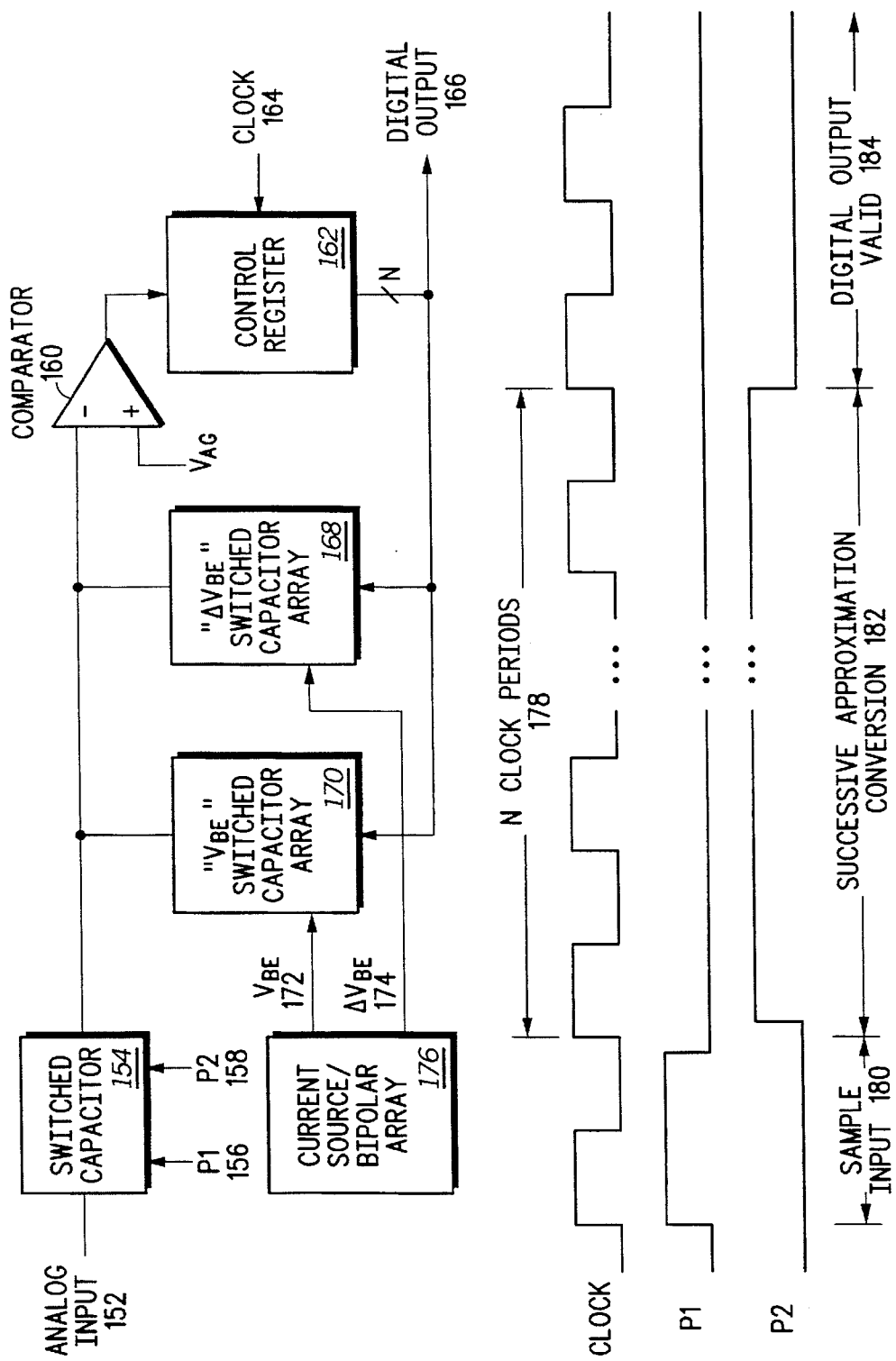
FIG. 4 illustrates a schematic block diagram of a third embodiment of a converter in accordance with the present invention.

FIG. 4 illustrates an N-bit successive approximation analog-to-digital converter 150. The converter 150 comprises generally, an analog input element 154, a first reference input element 168, a second reference input element 170, a comparator 160, and a reference adjustment element 162. The converter 150 may also include a voltage reference circuit 176 that provides a first temperature variant signal 174 and a second temperature variant signal 172.

The analog input element 154 operably couples an analog input signal 152 to a first input of the comparator 160. Preferably, the analog input element comprises a switched capacitor array selectively controlled by clock signals $P_1$ 156 and $P_2$ 158 which are complementary and non-overlapping. Thus, a consistent representation of the analog input signal is coupled to the first input of the comparator 160. The first reference input element 168 operably couples the first temperature variant signal 174 to the first input of the comparator 160 based on a control signal N. Finally, the second reference input element 172 operably couples the second temperature variant signal to the first input of the comparator 160 based on the control signal N. Preferably, the analog input element 154, the first reference input element 168, and the second reference input element 170 comprise switched capacitor arrays. Since switched capacitor arrays have been previously discussed and are known in the art, they are not discussed here.

The reference adjustment element 162 preferably comprises a control register that receives its input from the comparator 160, is controlled by a sampling clock, and produces an N bit digital output signal 166. The sampling clock, referred to as "Clock" in FIG. 4, has a minimum frequency of (N+1) times the frequency of $P_1$ and $P_2$. During a sample input interval 180, when clock signal $P_1$ is logic high, the analog input element 154 couples the analog input signal 152 to the first terminal of the comparator 160. Next, during the successive approximation conversion interval 182, when $P_2$ is logic high, the analog input signal 152 is successively compared to a variable reference N times over N clock periods 178. On each of the sampling clocks, the analog input signal 152 and a voltage level, input by the first reference input element 168 and the second reference input element 170, are compared at the comparator 160. The comparator 160 outputs a logic high signal if the analog input signal 152 exceeds the voltage level and a logic low level if not. The output of the comparator 160 becomes one of the N-bits of the digital signal at each sampling clock.

The N bit digital output signal 166 determines the level of the coupling of the temperature variant signals at each sampling clock. Generally speaking, the reference adjustment element 162 scales the outputs of the first reference input element 168 and the second reference input element 170 at each sampling clock attempting to drive the voltage at the first comparator 160 input to the voltage at the second comparator input. Resultantly, by latching the output of the comparator 160 at each sampling clock, an N-bit approximation of the value of analog input signal 152 is derived. Once the N sampling clocks have completed, the digital output becomes valid over interval 184.

Figure 5:
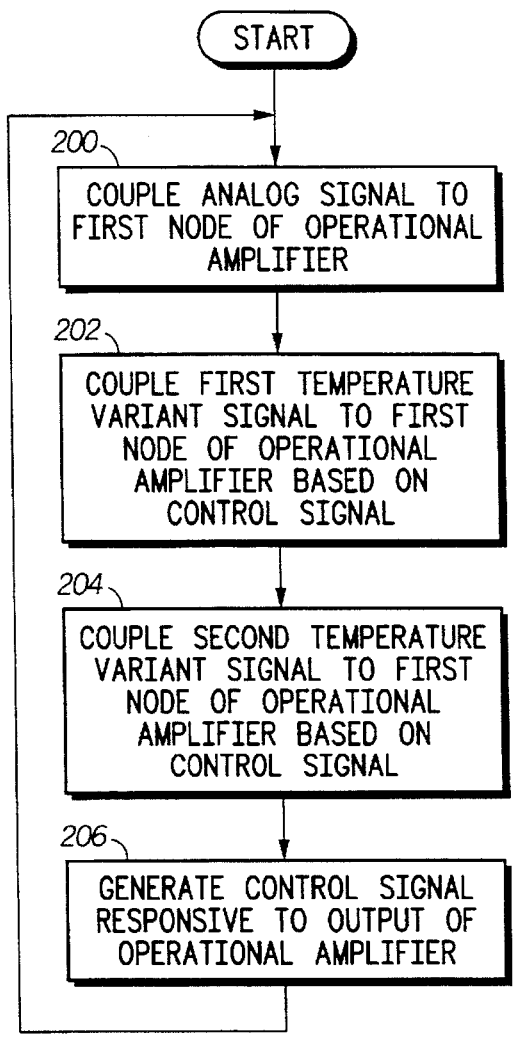
FIG. 5 illustrates a logic diagram that may be used to control a converter in accordance with the present invention.

FIG. 5 illustrates a logic diagram that may be used to implement converter 10. At step 200, an analog input signal 11 couples to a first node 13 of an operational amplifier 14. At step 202, a first temperature variant signal 16 is coupled, based on a control signal, to the first node 13 of the operational amplifier 14. At step 204, a second temperature variant signal 20 is coupled, based on the control signal, to the first node 13 of the operational amplifier 14. In accordance with the present invention steps 200, 202, and 204 are preferably performed simultaneously but are discussed separately for simplicity. Finally, at step 206, the control signal is generated responsive to the output 17 of the operational amplifier 14. After completing step 206, the method returns to step 200. Resultantly, due to the feedback control signal, the first temperature variant signal 16 and the second temperature variant signal 20 are adjusted to force the first input node 13 of the operational amplifier 14 to be electrically equivalent to the second input node 15 of the operational amplifier. Thus, negative feedback is provided and a conversion process is accomplished.

Figure 6:
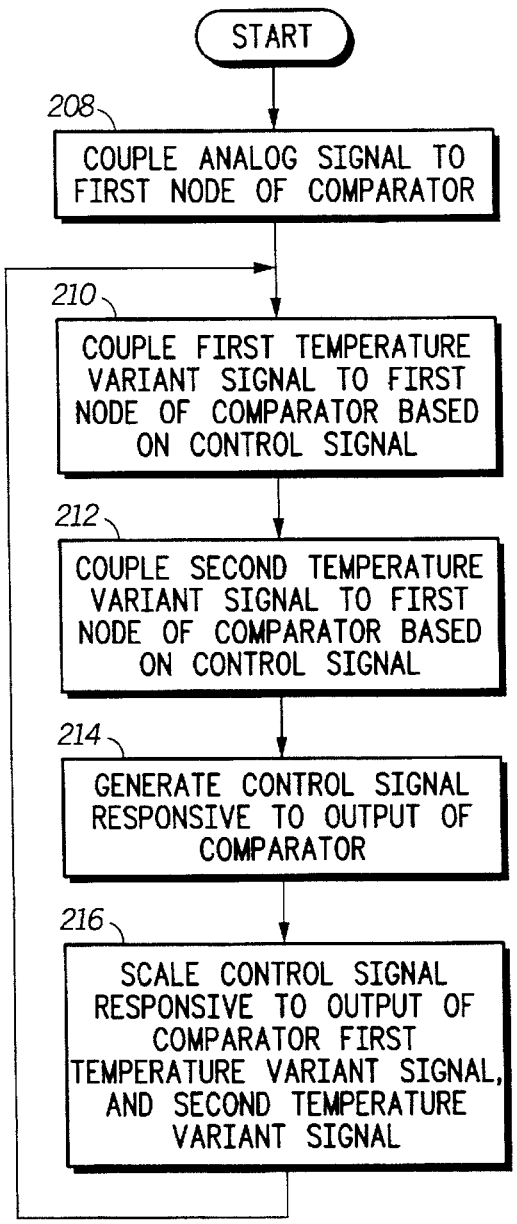
FIG. 6 illustrates an alternate logic diagram that may be used to control a converter in accordance with the present invention.

FIG. 6 illustrates a logic diagram that may be used to implement an N-bit successive approximation analog-to-digital converter 150. At step 208, an analog input signal 152 couples to a first node of a comparator 160. At step 210, a first temperature variant signal 174 is coupled, based on an N bit control signal 166, to the first node of the comparator 160. At step 212, a second temperature variant signal 172 is coupled, based on the N bit digital output signal 166, to the first node of the comparator 160. In accordance with the present invention steps 210 and 212 are preferably performed simultaneously but are discussed separately for simplicity. At step 214, a control signal is generated responsive to the output of the comparator 160. Finally, at step 216, the N bit digital control signal 166 is generated responsive to the output of the comparator 160, the first temperature variant signal 174, and the second temperature variant signal 172. After completing step 216, the method returns to step 210 for the next N–1 steps of the N-step approximation process.

Figure 7:
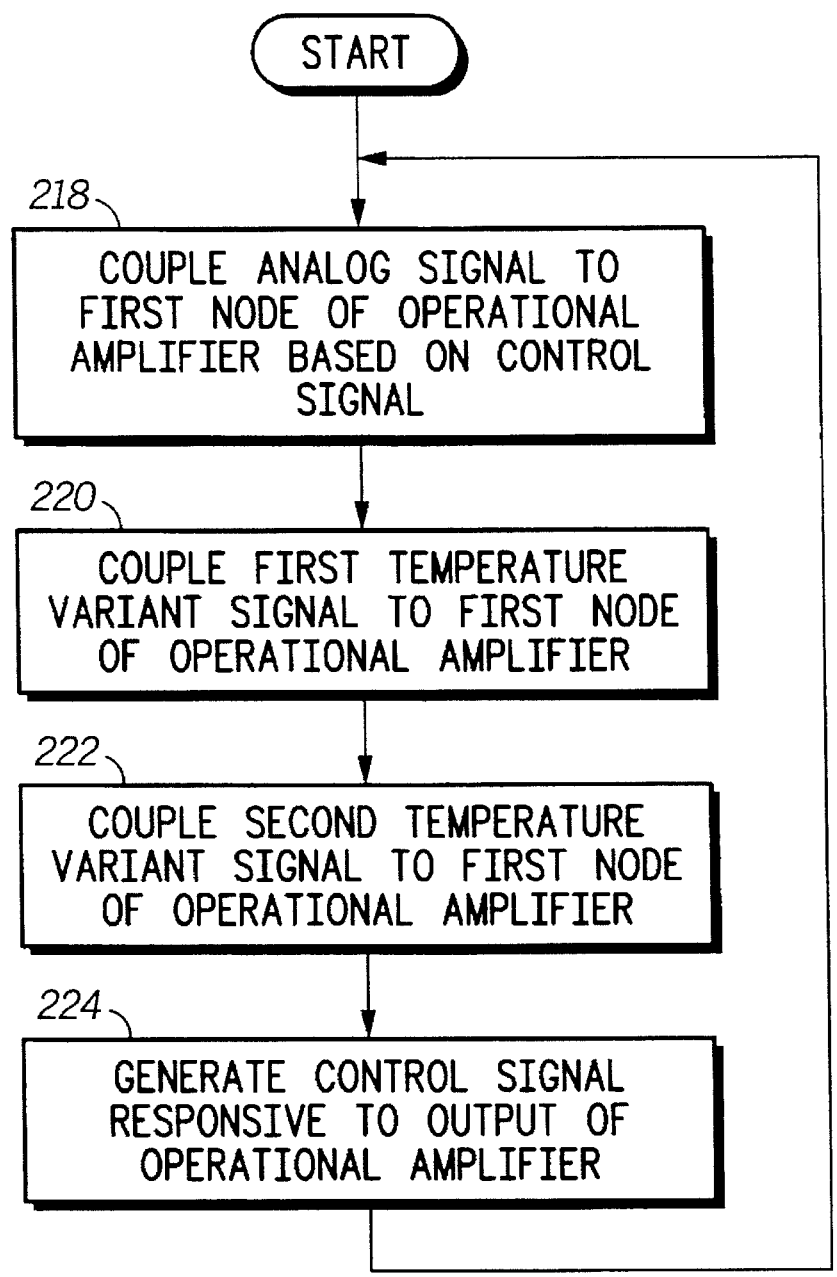
FIG. 7 illustrates yet another logic diagram that may be used to control a converter in accordance with the present invention.

FIG. 7 illustrates a logic diagram that may be used to implement a variation of converter 10 wherein the analog input signal 11 is operably coupled to the first node 13 of the operational amplifier 14 while the temperature variant signals are consistently coupled to the first node. At step 218, an analog input signal 11 couples to a first node 13 of an operational amplifier 14 based upon a control signal. At step 220, a first temperature variant signal 16 is coupled to the first node 13 of the operational amplifier 14. At step 222 a second temperature variant signal 20 is coupled to the first node 13 of the operational amplifier 14. In accordance with the present invention steps 218, 220, and 222 are preferably performed simultaneously but are discussed separately for simplicity. Finally, at step 224, the control signal is generated responsive to the output 17 of the operational amplifier 14. After completing step 224, the method returns to step 218. Resultantly, due to the feedback control signal, the analog input signal 11 is adjusted to force the first input node of the operational amplifier 14 to be electrically equivalent to the second node 15 of the operational amplifier 14. Thus, negative feedback is provided and a conversion process is accomplished.

The present invention provides an apparatus and method for converting analog data into digital data via a data converter that, for a first order converter, includes a single operational amplifier. By utilizing such a method and apparatus, a single order data converter may be achieved using a single operational amplifier, thereby reducing component count, reducing circuit complexity, reducing power consumption, and eliminating the need for voltage reference filtering pins in comparison with the prior art converter. In addition, the present converter provides a reliable analog-to-digital conversion.

The above described preferred embodiments are intended to illustrate the principles of the invention, but not to limit the scope of the invention. Various other embodiments and modifications to these preferred embodiments may be made by those skilled in the art without departing from the scope of the following claims. For example, an N-bit A/D converter may be included in the feedback path.

We claim:

1. A data converter comprising:

an operational amplifier having a first input node, a second input node, and an output node;

an analog input element that operably couples an analog signal to the first input node;

first reference input element that provides, based on a control signal, a first signal to the first input node;

second reference input element that provides, based on the control signal, a second signal to the first input node; and a control element that operably couples to the output node, wherein the control element generates the control signal responsive to the output node of the operational amplifier thereby forcing the first input node to be substantially electrically equivalent to the second input node.

2. The data converter of claim 1 further comprising an analog-to-digital element having an analog input node and a digital output node, wherein the analog input node is connected to the output node of the operational amplifier.

3. The data converter of claim 2 wherein the analog input element comprises a switched capacitor controlled at least partially by a clock signal, wherein the clock signal includes a first phase and a second phase.

4. The data converter of claim 3 wherein the first and second reference input elements comprise switched capacitors controlled at least partially by the clock signal.

5. The data converter of claim 4 wherein the control element generates the control signal based on the clock signal and an output of the analog-to-digital element.

6. The data converter of claim 1 Wherein the first signal and the second signal are produced by a voltage reference circuit comprising a plurality of bipolar transistors and a plurality of current sources.

7. The data converter of claim 1 further comprising:

a second operational amplifier having a third input node, a fourth input node, and a second output node, the third input node being coupled to the output node;

third reference input element that provides, based on a second control signal, a third signal to the third input node; and fourth reference input element that provides, based on the second control signal, a fourth signal to the third input node.

8. A successive approximation analog-to-digital converter comprising:

a comparator having a first input node, a second input node, and an output node;

analog input element that operably couples an analog signal to the first input node;

first reference input element that provides, based on a control signal, a first temperature variant signal to the first input node;

second reference input element that provides, based on the control signal, a second temperature variant signal to the first input node; and a reference adjustment element operably coupled to the comparator, the first reference input element, and the second reference input element, wherein the reference adjustment element produces the control signal such that a successive approximation of the analog signal is performed.

9. The successive approximation analog-to-digital converter of claim 8 wherein the analog input element comprises a switched capacitor controlled at least partially by a clock signal, wherein the clock signal includes a first phase and a second phase.

10. The successive approximation analog-to-digital converter of claim 9 wherein the first and second reference input elements comprise switched capacitors controlled at least partially by the clock signal.

11. The successive approximation analog-to-digital converter of claim 10 wherein the reference adjustment element receives the clock signal and an output of the comparator to produce the control signal.

12. The successive approximation analog-to-digital converter of claim 8 wherein the first and second temperature variant signals are produced by a voltage reference circuit comprising a plurality of bipolar transistors and a plurality of current sources.

13. A data converter comprising:

an operational amplifier having a first input node, a second input node, and an output node;

an analog input element that operably couples, based upon a control signal, an analog signal to the first input node;

first reference input element that provides a first temperature variant signal to the first input node;

second reference input element that provides a second temperature variant signal to the first input node; and a control element that operably couples to the output node, wherein the control element generates the control signal responsive to the output node of the operational amplifier thereby forcing the first input node to be substantially electrically equivalent to the second input node.

14. The data converter of claim 13 further comprising an analog-to-digital element having an analog input node and a digital output node, wherein the analog input node is connected to the output node of the operational amplifier.

15. The data converter of claim 14 wherein the analog input element comprises a switched capacitor controlled at least partially by a clock signal, wherein the clock signal includes a first phase and a second phase.

16. The data converter of claim 15 wherein the first and second reference input elements comprise switched capacitors controlled at least partially by the clock signal.

17. The data converter of claim 16 wherein the control element generates the control signal based on the clock signal and an output of the analog-to-digital element.

18. The data converter of claim 13 wherein the first and second temperature variant signals are produced by a voltage reference circuit comprising a plurality of bipolar transistors and a plurality of current sources.

19. A method of controlling a data converter comprising the steps of:

(a) operably coupling an analog signal to a first input node of an operational amplifier;

(b) coupling, based on a control signal, a first temperature variant signal to the first input node;

(c) coupling, based on the control signal, a second temperature variant signal to the first input node;

(d) coupling a reference to a second input node of the operational amplifier; and (e) generating, responsive to an output of the operational amplifier, the control signal such that the first input node is forced to be substantially electrically equivalent to the second input node.

20. A method of controlling a successive approximation analog-to-digital converter comprising the steps of:

(a) operably coupling an analog signal to a first input node of a comparator;

(b) coupling, based on a control signal, a first temperature variant signal to the first input node;

(c) coupling, based on the control signal, a second temperature variant signal to the first input node;

(d) coupling a reference to a second input node of the comparator;

(e) generating, responsive to an output of the comparator, the control signal such that the first input node is forced to be substantially electrically equivalent to the second input node; and (f) scaling the control signal based on an output of the comparator, the first temperature variant signal, and the second temperature variant signal, to produce a successive approximation of the analog signal.

21. A method of controlling a data converter comprising the steps of:

(a) operably coupling, based upon a control signal, an analog signal to a first input node of an operational amplifier;

(b) coupling a first temperature variant signal to the first input node;

(c) coupling a second temperature variant signal to the first input node;

(d) coupling a reference to a second input node of the operational amplifier; and (e) generating, responsive to an output of the operational amplifier, the control signal such that the first input node is forced to be substantially electrically equivalent to the second input node.

* * * * *